United States Patent
Brown et al.

(10) Patent No.: US 6,328,041 B1
(45) Date of Patent: Dec. 11, 2001

(54) UNIVERSAL CLEANING WAFER FOR A PLASMA CHAMBER

(75) Inventors: Jeffrey J. Brown, Fishkill; Christopher N. Collins, Poughkeepsie; Wilson Tong Lee, Hopewell Junction; George A. Kaplita, Wappingers Falls; Stefan Schmitz, Pleasant Valley; Len Yuan Tsou, New City, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/156,881

(22) Filed: Sep. 18, 1998

(51) Int. Cl.[7] ................. B08B 7/04; B08B 7/00
(52) U.S. Cl. .............. 134/1.1; 134/1; 134/1.2; 134/902; 134/22.1; 134/22.18; 156/345
(58) Field of Search ............... 134/1, 1.2, 1.1, 134/902, 22.1, 22.18; 216/67, 74, 75, 76, 77, 78, 79, 80; 156/345; 438/905

(56) References Cited

U.S. PATENT DOCUMENTS

| | | | |
|---|---|---|---|
| 4,960,488 | * | 10/1990 | Law et al. ............................ 156/643 |
| 5,158,644 | * | 10/1992 | Cheung et al. ....................... 156/643 |
| 5,240,555 | * | 8/1993 | Kilburn ................................ 156/643 |
| 5,503,676 | * | 4/1996 | Shufflebotham et al. ..... 118/723 MR |
| 5,507,874 | * | 4/1996 | Su et al. .................................... 134/1 |
| 5,705,080 | * | 1/1998 | Leung et al. ............................ 216/67 |
| 5,810,937 | * | 9/1998 | Gupta et al. ........................... 134/1.2 |

FOREIGN PATENT DOCUMENTS 5-55184  *  3/1993  (JP) ....................................................

OTHER PUBLICATIONS

Derwent publication 89–098219, Feb. 1989.*

* cited by examiner

Primary Examiner—Alexander Markoff
(74) Attorney, Agent, or Firm—Ira D. Blecker

(57) ABSTRACT

A cleaning wafer is used during the vaporization of particulate deposits that were previously deposited on the walls of a plasma chamber. The cleaning wafer includes a first dielectric layer, a conducting layer and a second dielectric layer covering the conducting layer.

21 Claims, 1 Drawing Sheet

UNIVERSAL CLEANING WAFER FOR A PLASMA CHAMBER

BACKGROUND OF THE INVENTION

This invention relates to a method of cleaning plasma chambers used for processing semiconductor wafers and, more particularly, a method of cleaning such plasma chambers utilizing a universal cleaning wafer suitable for use with an electrostatic clamping chuck or a mechanical clamping chuck.

Plasma processing of semiconductor wafers involves the performance of one or more plasma processes such as gas chemistry etching, or chemical vapor deposition on one or more semiconductor wafers within the plasma chamber. As the geometries of semiconductor devices become smaller, the ability to maintain the uniformity and accuracy of critical dimensions becomes strained. Many of the processes carried out within semiconductor processing reactors leave contaminant deposits throughout the process chamber which accumulate and become the source of particulate matter harmful to the creation of a semiconductor device. The non-volatile particulate matter tend to remain inside the plasma chamber in the form of loosely attached particles to the various element surfaces of the plasma chamber. As the dimension size of the semiconductor device has become smaller, the presence of particulate matter upon the surface of the semiconductor wafer has become more of a risk factor. Consequently, the cleanliness of plasma processing chambers (i.e., plasma etching, reactive ion etching (RIE), plasma enhanced chemical vapor deposition (PECVD), etc.) is critical.

Removal of contaminants from the various surfaces inside a plasma chamber has been accomplished by periodically cleaning the plasma chamber. Known cleaning methods have involved opening the plasma chamber, disassembling portions of the chamber, and removing the contaminant deposits by physical or chemical methods. Such cleaning methods are complicated, disruptive, time consuming and can be the source of additional contamination.

Recognizing the disadvantages of disassembling the plasma chamber for cleaning, it has been proposed in Law et al. U.S. Pat. Nos. 4,960,488, Cheung et al. 5,158,644, and Shufflebotham et al. 5,503,676, the disclosures of which are incorporated by reference herein, to use an etching plasma to self-clean the plasma chamber. The gas used in the self-cleaning is chosen so as to chemically react with the particulate matter and vaporize it but at the same time avoiding damage to the chamber hardware. Su et al. U.S. Pat. No. 5,507,874, the disclosure of which is incorporated by reference herein, is similar to the above references but the teaching is directed to the cleaning of an electrostatic chuck.

Kilburn et al. U.S. Pat. No. 5,240,555, the disclosure of which is incorporated by reference herein, discloses a cleaning wafer that is used during the self-cleaning of an etching machine. The purpose of the cleaning wafer is to activate the radio frequency power which is used to create the cleaning plasma. The cleaning wafer is made from the same material as the interior of the etching machine to avoid contamination by foreign elements. The cleaning wafer could be aluminum as disclosed by Kilburn et al. or any of a wide variety of unspecified materials.

Electrostatic chucks are devices for holding or clamping semiconductor wafers during plasma manufacturing processes. An electrostatic chuck secures the entire lower surface of a semiconductor wafer by Coulombic force and provides an alternative to mechanical clamping of the semiconductor wafer to the support platform or pedestal. A clear advantage in using an electrostatic chuck is that it eliminates the need for mechanical clamping mechanisms, which physically contact the front of the wafer inducing contamination on the surface of the wafer. Additionally, when a semiconductor wafer is secured to the electrostatic chuck, the flatness of the semiconductor wafer is improved, improving things like the across wafer thermal cooling.

While the Kilburn et al. aluminum cleaning wafer would work with an electrostatic chuck, it would not be inert to many cleaning plasmas. Assuming that Kilburn et al.s cleaning wafer could be made of a different material, such as ceramic, a ceramic cleaning wafer would not work with an electrostatic chuck although it would be inert to many cleaning plasmas.

Thus, a problem with the Kilburn et al. cleaning wafer is that it is not suitable for electrostatic chucks while also being resistant to the cleaning plasma.

It is accordingly a purpose of the present invention to have a universal cleaning wafer that is both inert to many cleaning plasmas and that is usable with an electrostatic chuck.

It is another purpose of the present invention to have a universal cleaning wafer that is suitable for use with both electrostatic chucks and mechanical chucks.

These and other purposes of the invention will become more apparent after referring to the following description of the invention in conjunction with the accompanying drawings.

BRIEF SUMMARY OF THE INVENTION

One aspect of the invention relates to a method of cleaning a plasma chamber having a chuck for holding a semiconductor wafer and particulate deposits remaining from a previous plasma utilizing operation, the method comprising the steps of:

a. obtaining a cleaning wafer comprising a first dielectric layer, conducting layer and a second dielectric layer covering the conducting layer;

b. placing the cleaning wafer on the chuck with the second dielectric layer in direct contact with the chuck;

c. generating a plasma in the plasma chamber for a predetermined interval of time to vaporize particulate deposits within the plasma chamber; and d. removing the vaporized particulate deposits from the plasma chamber.

A second aspect of the invention relates to a method of operating a plasma chamber having a chuck for holding a semiconductor wafer the method comprising the steps of:

a. placing a semiconductor wafer on the chuck in the plasma chamber;

b. generating a plasma in the plasma chamber for a predetermined interval of time to process the semiconductor wafer, the processing causing particulate deposits to form in the plasma chamber;

c. removing the semiconductor wafer from the plasma chamber;

d. optionally processing additional semiconductor wafers;

e. placing on the chuck a cleaning wafer comprising a first dielectric layer, conducting layer and a second dielectric layer covering the conducting layer, the second dielectric layer being in direct contact with the chuck;

f. generating a plasma for a predetermined interval of time to vaporize the particulate deposits within the plasma chamber; and g. removing the flowing gas and vaporized particulate deposits form the plasma chamber.

A third aspect of the invention relates to a plasma apparatus comprising a plasma chamber having a chuck for holding a semiconductor wafer and a cleaning wafer comprising a first dielectric layer, conducting layer and a second dielectric layer covering the conducting layer; wherein, in operation, the cleaning wafer is placed on the chuck and a plasma generated after a predetermined number of semiconductor wafers have been processed, the processing of the semiconductor wafers causing particulate deposits to form in the plasma chamber, the plasma generated while using the cleaning wafer causing the vaporization and removal of the particulate deposits.

A fourth aspect of the invention relates to a cleaning wafer for use in cleaning a plasma chamber of particulate matter comprising a first dielectric layer, a conducting layer and a second dielectric layer covering the conducting layer, wherein the first dielectric layer is substantially thicker than either of the conducting layer or the second dielectric layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
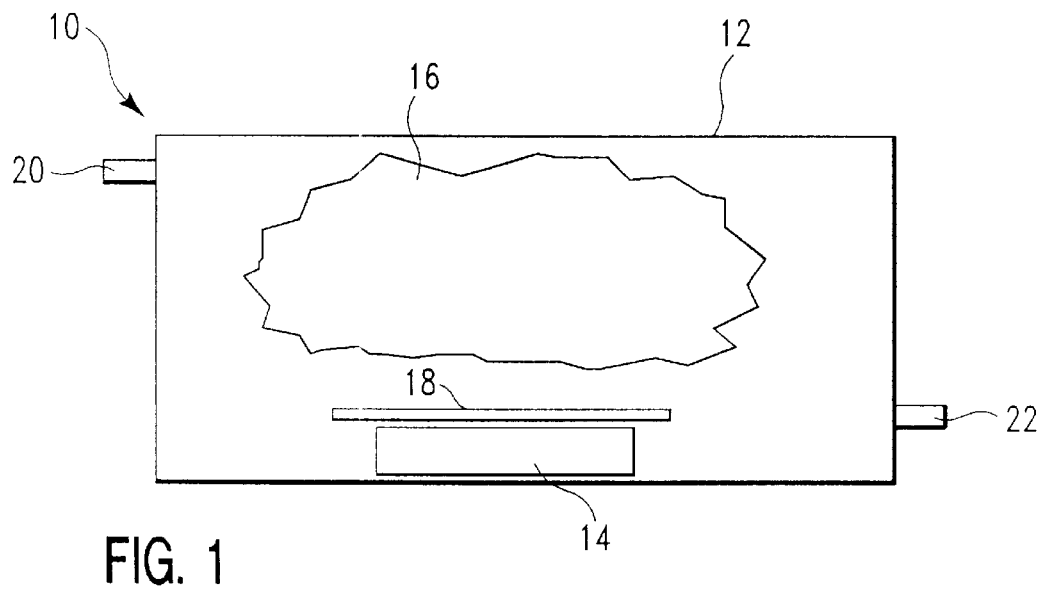
FIG. 1 is a schematical view in cross section of a first type of plasma chamber apparatus and the cleaning wafer according to the present invention on an electrostatic chuck.

Referring now to FIG. 1, a first type of plasma chamber apparatus, generally indicated by 10, is schematically shown in cross section. Plasma chamber apparatus 10 includes plasma chamber 12, chuck 14 for holding a semiconductor wafer (not shown), plasma 16, gas inlet 20 for the entry of a suitable gas, and gas outlet 22 for the exit of the gas and other volatiles. On top of chuck 14 is universal cleaning wafer 18.

It should be understood that chuck 14 can be a mechanical chuck or an electrostatic chuck. Preferably, chuck 14 is an electrostatic chuck. However, since universal cleaning wafer 18 can be readily used with either kind of chuck, the universality of the universal cleaning wafer 18 can be appreciated.

Plasma 16 shown in plasma chamber 12 or produced in plasma chamber 12 of FIG. 1 may be generated by any known source including, but not limited to, RF source, multiple RF sources or microwave.

Some plasma chambers utilize a downstream plasma source where the plasma is actually formed outside of the plasma chamber by conventional means and then transported into the plasma chamber.

Figure 2:
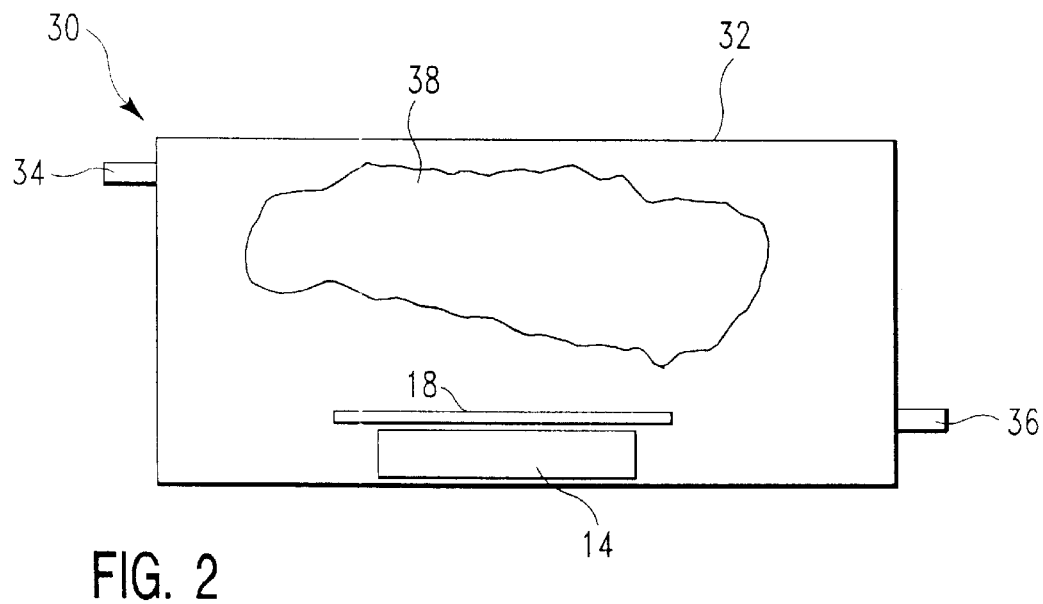
FIG. 2 is a schematical view in cross section of a second type of plasma chamber apparatus and the cleaning wafer according to the present invention on an electrostatic chuck.

Referring now to FIG. 2, a second type of plasma chamber apparatus, generally indicated by 30, is schematically shown in cross section. Plasma chamber apparatus 30 includes plasma chamber 32, chuck 14 for holding a semiconductor wafer (not shown), plasma 38, inlet 34 for the entry of the plasma 38 and outlet 36 for the exit of the reactant by-products and other volatiles. In plasma chamber apparatus 30, the plasma 38 is actually formed in another chamber (not shown) and transported into plasma chamber 32. Although not formed in plasma chamber 32, plasma 38 shall nevertheless be considered for purposes of the present invention to be generated or produced in plasma chamber 32. On top of chuck 14 is universal cleaning wafer 18.

Figure 3:
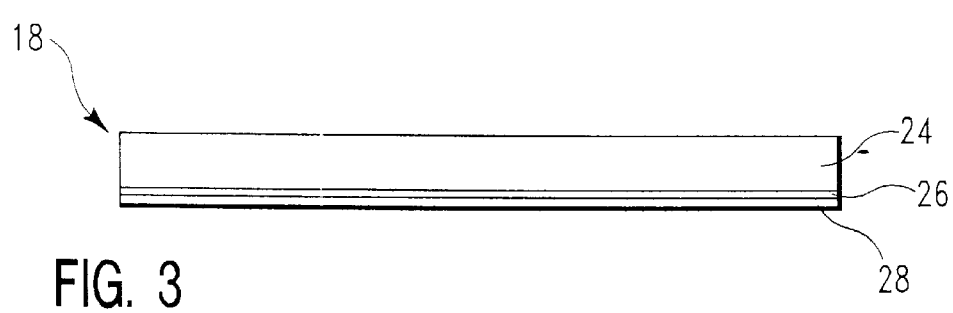
FIG. 3 is a cross section of the cleaning wafer according to the present invention.

Referring now to FIG. 3, there is shown a cross sectional view of the universal cleaning wafer 18 which consists of a bulk ceramic (dielectric) portion 24 and conductive thin film 26 and dielectric thin film 28. The bulk ceramic portion 24 is substantially thicker than the thin films 26 and 28. By substantially thicker, it is meant that bulk ceramic portion 24 is at least several hundred times thicker than thin films 26 and 28, as it is bulk ceramic portion 24 that will get exposed to any erosion from sputtering. While universal cleaning wafer 18 is shown in cross section, it should be understood that universal cleaning wafer 18 is generally circular in nature.

Universal cleaning wafer 18 should preferably be the same size and shape as the standard silicon wafer used for semiconductor device production. That is, universal cleaning wafer 18 can be a direct substitute for a silicon wafer during the operation of the cleaning plasma. It should be understood, however, that cleaning wafer 18 can be larger or smaller than the silicon wafer, depending on the equipment utilized and the location of the particulate matter remaining in the plasma chamber 12.

Bulk ceramic portion 24 is preferably $Al_2O_3$ but may also be SiC, $Si_3N_4$ or $SiO_2$. Thin film 26 should be a conductive metal to provide operability of the universal cleaning wafer 18 with an electrostatic chuck. The conductive metal of the thin film 26 should preferably be silicon but could also be aluminum or copper. Lastly, thin film 28 is preferably $Al_2O_3$ but could also be $SiO_2$, SiC or $Si_3N_4$. Thin film 28 covers thin film 26 to protect thin film 26 from the cleaning plasma. Depending on the material of thin film 26 and the plasma application, complete encapsulation of thin film 26 by thin film 28 may be required. For example, where thin film 26 is copper, complete encapsulation would be required if copper contamination is a problem for the plasma application.

The back of the wafer is usually contacted by the cleaning plasma. By burying the conductive thin film 26, contact with the cleaning plasma is thus avoided. If conductive thin film 26 is contacted by the cleaning plasma and ordinarily would be etched by the cleaning plasma, then by burying the conductive thin film 26 or completely encapsulating it as discussed above, thin film 26 will not be etched (i.e., removed) by the cleaning plasma, thereby avoiding recoating the universal cleaning wafer 18 periodically and, further, avoiding contamination in the plasma chamber 12. Thin film 28 thus improves the life of universal clean wafer 18. Moreover, because of the layered structure of universal clean wafer 18, it can be used in any type of plasma chamber with any type of chuck.

The choice of materials, as well as their thickness, is dependent on the cleaning plasma utilized. For the most versatility, it is preferred that the universal cleaning wafer 18 comprise $Al_2O_3$ bulk ceramic portion 24, followed by thin film 26 of silicon and thin film 28 of $Al_2O_3$. The thickness of bulk ceramic portion 24 is nominally 750 microns, and the thickness of each of thin films 26 and 28 is nominally 1 microns. If thin film 28 were of a higher dielectric material, the thickness would have to be less than 1 micron so as to achieve an adequate clamp with the electrostatic chuck.

The universal cleaning wafer 18 according to the present invention was made in the following manner. A bulk $Al_2O_3$ wafer, 740 microns in thickness, was purchased from LTD Ceramics, Inc., Menlo Park, Calif. 92025. Since the size and shape of the bulk ceramic is, in the preferred embodiment of the invention, equivalent to that of a typical silicon wafer as used in the semiconductor industry, thin films 26 and 28 may be formed by using conventional semiconductor deposition equipment. Thus, 1 micron of silicon was deposited on the bulk ceramic wafer by DC Magnetron sputtering followed by deposition of 1 micron of $Al_2O_3$ by PECVD.

During the normal operation of a plasma chamber apparatus 10, one or more silicon wafers would be processed. By processed, it is meant that the silicon wafer would undergo etching (e.g., by RIE) or deposition (e.g., by PECVD). As a result of this processing, particulate matter would be loosely deposited on the walls of the plasma chamber 12 or 32 as is well known to those skilled in the art. If this particulate matter is not removed, some of the particulates can fall on the semiconductor wafer, thereby adversely affecting the quality of the semiconductor wafer. Accordingly, after a predetermined number of semiconductor wafers are processed (the precise number being determined by the equipment, operator, type of plasma, materials, etc.), a universal cleaning wafer is inserted in the plasma chamber 12 or 32 and placed on the chuck 14, with thin film 28 in direct contact with the chuck 14. Thereafter, a cleaning plasma is generated in plasma chamber 12 or 32. The universal cleaning wafer 18 is chosen so as to be relatively inert to the cleaning plasma, thereby avoiding sputtering of the universal cleaning wafer 18 and further contamination of the plasma chamber 12 or 32. The universal cleaning wafer 18 does not actually participate in the cleaning of the plasma chamber 12 or 32 but rather protects the chuck 14 from the cleaning plasma and also activates the sensing switch (if one is present) to indicate that a wafer is on the chuck so that the plasma can be generated. The cleaning plasma causes the particulate matter in the plasma chamber 12 or 32 to be volatilized and removed from the plasma chamber 12 or 32 when the gases and volatiles are exhausted through outlet 22 or 36. The universal cleaning wafer 18 may then be removed and replaced by a semiconductor wafer.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of cleaning a plasma chamber having a chuck for holding a semiconductor wafer and particulate deposits remaining from a previous plasma utilizing operation, the method comprising the steps of:
   a. obtaining a cleaning wafer comprising a first dielectric layer, conducting layer and a second dielectric layer, wherein the thickness of the first dielectric layer is 750 microns, the thickness of the conducting layer is 1 micron, and the thickness of the second dielectric layer is 1 micron;
   b. placing the cleaning wafer on the chuck with the second dielectric layer in direct contact with the chuck;
   c. generating a plasma in the plasma chamber for a predetermined interval of time to vaporize particulate deposits within the plasma chamber, wherein the second dielectric layer protects the conducting layer from the plasma; and
   d. removing the vaporized particulate deposits from the plasma chamber.

2. The method of claim 1 wherein the material for the first dielectric layer is selected from the group consisting of $Al_2O_3$, SiC, $Si_3N_4$ and $SiO_2$.

3. The method of claim 1 wherein the material for the conducting layer is selected from the group consisting of silicon, aluminum and copper.

4. The method of claim 1 wherein the material for the second dielectric layer is selected from the group consisting of $Al_2O_3$, SiC, $Si_3N_4$ and $SiO_2$.

5. The method of claim 1 wherein the material of the cleaning wafer is selected such that when the plasma is generated, the plasma does not cause etching of the cleaning wafer.

6. The method of claim 1 wherein the cleaning wafer is substantially the same shape and size as the semiconductor wafer.

7. A method of operating a plasma chamber having a chuck for holding a semiconductor wafer, the method comprising the steps of:
   a. placing a semiconductor wafer on the chuck in the plasma chamber;
   b. generating a plasma in the plasma chamber for a predetermined interval of time to process the semiconductor wafer, the processing causing particulate deposits to form in the plasma chamber;
   c. removing the semiconductor wafer from the plasma chamber;
   d. optionally processing additional semiconductor wafers;
   e. placing on the chuck a cleaning wafer comprising a first dielectric layer, conducting layer and a second dielectric layer, wherein the thickness of the first dielectric layer is 750 microns, the thickness of the conducting layer is 1 micron, and the thickness of the second dielectric layer is 1 micron;
   f. generating a plasma for a predetermined interval of time to vaporize particulate deposits within the plasma chamber, wherein the second dielectric layer protects the conducting layer from the plasma; and
   d. removing flowing gas and the vaporized particulate deposits from the plasma chamber.

8. The method of claim 7 wherein the material for the first dielectric layer is selected from the group consisting of $Al_2O_3$, SiC, $Si_3N_4$ and $SiO_2$.

9. The method of claim 7 wherein the material for the conducting layer is selected from the group consisting of silicon, aluminum and copper.

10. The method of claim 7 wherein the material for the second dielectric layer is selected from the group consisting of $Al_2O_3$, SiC, $Si_3N_4$ and $SiO_2$.

11. The method of claim 7 wherein the material of the cleaning wafer is selected such that when the plasma is generated, the plasma does not cause etching of the cleaning wafer.

12. The method of claim 7 wherein the cleaning wafer is substantially the same shape and size as the semiconductor wafer.

13. A plasma apparatus comprising a plasma chamber having a chuck for holding a semiconductor wafer and a cleaning wafer comprising a first dielectric layer, conducting layer and a second dielectric layer, wherein the thickness of the first dielectric layer is 750 microns, the thickness of the conducting layer is 1 micron, and the thickness of the second dielectric layer is 1 micron;

wherein, in operation, the cleaning wafer is placed on the chuck and a plasma is generated after a predetermined number of semiconductor wafers have been processed, the processing of the semiconductor wafers causing particulate deposits to form in the plasma chamber, the plasma generated while using the cleaning wafer causing the vaporization and removal of the particulate deposits, and wherein the second dielectric layer protects the conducting layer from the plasma.

14. The plasma apparatus of claim 13 wherein the material for the first dielectric layer is selected from the group consisting of $Al_2O_3$, SiC, $Si_3N_4$ and $SiO_2$.

15. The plasma apparatus of claim 13 wherein the material for the conducting layer is selected from the group consisting of silicon, aluminum and copper.

16. The plasma apparatus of claim 13 wherein the material for the second dielectric layer is selected from the group consisting of $Al_2O_3$, SiC, $Si_3N_4$ and $SiO_2$.

17. The plasma apparatus of claim 13 wherein the cleaning wafer is substantially the same shape and size as the semiconductor wafer.

18. A cleaning wafer for use in cleaning a plasma chamber of particulate matter comprising a first dielectric layer, conducting layer and a second dielectric layer, wherein the thickness of the first dielectric layer is 750 microns, the thickness of the conducting layer is 1 micron, and the thickness of the second dielectric layer is 1 micron, and wherein the second dielectric layer protects the conducting layer from the plasma.

19. The cleaning wafer of claim 18 wherein the material for the first dielectric layer is selected from the group consisting of $Al_2O_3$, SiC, $Si_3N_4$ and $SiO_2$.

20. The cleaning wafer of claim 18 wherein the material for the conducting layer is selected from the group consisting of silicon, aluminum and copper.

21. The cleaning wafer of claim 18 wherein the material for the second dielectric layer is selected from the group consisting of $Al_2O_3$, SiC, $Si_3N_4$ and $SiO_2$.

* * * * *